United States Patent [19]
Wood et al.

[11] Patent Number: 5,495,179
[45] Date of Patent: Feb. 27, 1996

[54] CARRIER HAVING INTERCHANGEABLE SUBSTRATE USED FOR TESTING OF SEMICONDUCTOR DIES

[75] Inventors: Alan G. Wood, Boise; Warren M. Farnworth, Nampa, both of Id.

[73] Assignee: Micron Technology, Inc., Boise, Id.

[21] Appl. No.: 124,899

[22] Filed: Sep. 21, 1993

Related U.S. Application Data

[63] Continuation-in-part of Ser. No. 46,675, Apr. 14, 1993, Pat. No. 5,367,253, which is a continuation-in-part of Ser. No. 973,931, Nov. 10, 1992, Pat. No. 5,302,891, which is a continuation of Ser. No. 709,858, Jun. 4, 1991, abandoned.

[51] Int. Cl.$^6$ .......................... G01R 31/02; G01R 31/26
[52] U.S. Cl. .......................... 324/755; 324/765
[58] Field of Search .......................... 324/158 P, 158 F, 324/72.5, 754, 755, 758, 761, 762, 765

[56] References Cited

U.S. PATENT DOCUMENTS

| | | | |
|---|---|---|---|
| 3,437,929 | 4/1969 | Glenn | 324/158 P |
| 3,810,016 | 7/1974 | Chayka et al. | |
| 4,312,117 | 1/1982 | Robillard et al. | 29/589 |
| 4,506,938 | 3/1985 | Madden. | |
| 4,585,991 | 4/1986 | Reid et al. | 156/647 X |
| 4,636,722 | 1/1987 | Ardezzone | 324/158 P |
| 4,758,785 | 7/1988 | Rath | 324/158 P |
| 4,922,192 | 5/1990 | Gross et al. | |
| 4,924,589 | 5/1990 | Leedy | 29/832 |
| 4,937,653 | 6/1990 | Blonder | 357/68 |
| 4,952,272 | 8/1990 | Okino et al. | 156/630 |
| 4,963,225 | 10/1990 | Lehman-Lamer | 156/630 |
| 5,006,792 | 4/1991 | Malhi et al. | |
| 5,055,778 | 10/1991 | Okubo et al. | 324/158 P |
| 5,066,907 | 11/1991 | Tarzwell et al. | |
| 5,072,116 | 12/1991 | Kawade et al. | 250/306 |
| 5,073,117 | 12/1991 | Malhi | 439/71 |
| 5,088,190 | 2/1992 | Malhi | 29/843 |
| 5,103,557 | 4/1992 | Leedy | 29/832 |
| 5,123,850 | 6/1992 | Elder et al. | 439/67 |
| 5,148,103 | 9/1992 | Pasiecznik, Jr. | |
| 5,177,438 | 1/1993 | Littlebury et al. | 324/158 P |
| 5,177,439 | 1/1993 | Liu et al. | 324/158 P |
| 5,262,718 | 11/1993 | Svendsen et al. | 324/158 P |
| 5,304,922 | 4/1994 | Betz et al. | |
| 5,323,035 | 6/1994 | Leedy | 257/248 |
| 5,326,428 | 7/1994 | Farnworth et al. | 156/654 |

Primary Examiner—Ernest F. Karlsen
Attorney, Agent, or Firm—Stanley Protigal; Stephen A. Gratton

[57] ABSTRACT

A carrier for testing a singularized semiconductor die prior to packaging the die utilizes a removable die supporting substrate. The die is placed in the carrier and is electrically connected to the substrate, thereby allowing for the packaging or other use of only known good die. A bridge clamp presses against a rigid cover which, in turn, bias the die against a plurality of die contacting members located on the die supporting substrate. The use of the removable die supporting substrate permits a single carrier design to accommodate different die types and further permits handling equipment to mechanically handle the one carrier design. This facilitates the handling of the carrier so that the carrier can be conveniently used during burn-in and test procedures.

19 Claims, 8 Drawing Sheets

CARRIER HAVING INTERCHANGEABLE SUBSTRATE USED FOR TESTING OF SEMICONDUCTOR DIES

CROSS-REFERENCE TO RELATED APPLICATION

This is a continuation-in-part to U.S. patent application Ser. No. 8/046,675, filed Apr. 14, 1993, now U.S. Pat. No. 5,367,253, which is a continuation-in-part to U.S. patent application Ser. No. 7/973,931, filed Nov. 10, 1992, now U.S. Pat. No. 5,302,891 which is a continuation of Ser. No. 7/709,858, filed Jun. 4, 1991, now abandoned.

FIELD OF THE INVENTION

This invention relates to the field of semiconductor device testing. More specifically, the invention relates to an apparatus for supporting semiconductor die in carriers during burn-in and test procedures.

BACKGROUND OF THE INVENTION

Many types of semiconductor devices are made using similar manufacturing procedures. A starting substrate, usually a thin wafer of silicon, is doped, masked, and etched through several process steps, the steps depending on the type of devices being manufactured. This process yields a number of die on each wafer produced. Each die on the wafer is given a brief test for full functionality, and the nonfunctional die are mechanically marked or mapped in software. This brief test is only a gross measure of functionality, and does not insure that a die is completely functional or has specifications that would warrant its assembly in a package.

If the wafer has a yield of grossly functional die, it indicates that a good quantity of die from the wafer are likely to be fully operative. The die are separated with a die saw, and the nonfunctional die are scrapped, while the rest are individually encapsulated in plastic packages or mounted in ceramic packages with one die in each package. After the die are packaged they are rigorously electrically tested. Components which turn out to be nonfunctional, or which operate at questionable specifications, are scrapped or devoted to special uses.

Packaging unusable die, only to scrap them after testing, is a waste of time and materials, and is therefore costly. Given the relatively low profit margins of commodity semiconductor components such as dynamic random access memories (DRAMs) and static random access memories (SRAMs), this practice is uneconomical. However, no thorough and cost effective method of testing an unpackaged die is available which would prevent this unnecessary packaging of nonfunctional and marginally functional die. Secondly, the packaging may have other limitations which are aggravated by burn-in stress conditions, so that the packaging becomes a limitation for burn-in testing.

It is proposed that multiple integrated circuit devices be packaged as a single unit, known as a multi chip module (MCM). This can be accomplished with or without conventional lead frames. This creates two problems when using conventional test methods. Firstly, discrete testing is more difficult because a conventional lead frame package is not used. Furthermore, when multiple devices are assembled into a single package, the performance of the package is reduced to that of the die with the lowest performance. Therefore, such dies are tested on an individual basis at probe, using ambient and "hot chuck" test techniques, while still in wafer form. In other words, the ability to presort the individual dice is limited to that obtained through probe testing.

In addition, there is an increased interest in providing parts which are fully characterized prior to packaging. This is desired not only because of the cost of the package, but also because there is demand for multi-chip modules (MCMs), in which multiple parts in die form are tested and assembled into a single unit. While there are various techniques proposed for testing, burning in and characterizing a singulated die, it would be advantageous to be able to "wafer map" the die prior to assembly with as many performance characteristics as possible. Ideally, one would want to be able to map the wafer with full device characterization.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$C_{DIE} \times \frac{C_{PACKAGE}}{Yield} = C_{DIE} \times C_{ADDL. KGD}$$

where

C=cost $C_{DIE}$=manufacturing cost of functional die $C_{ADDL. KGD}$=additional cost of testing unpackaged die in order to produce known good die (KGD)

Note that in the case of discretely packaged parts, the cost of the die ($C_{DIE}$) is essentially not a factor. This changes in the case of MCMs:

$$(C_{DIE}) \times \frac{(\text{number of die})}{Yield} \times \underline{C}_{PACKAGE} = C_{DIE} \times C_{ADDL. KGD}$$

Note that again $C_{DIE}$ is not a factor in modules having identical part types; however, the equation must be modified to account for varied costs and yields of die in modules with mixed part types.

With MCMs, the cost of packaging a failed part is proportional to the number of die in the module. In the case of a ×16 memory array module, where probe-to-ship yield of the die is 95%, the costs are:

$$\frac{16}{0.95} \times C_{PACKAGE} = C_{ADDL. KGD}$$

so the additional costs of testing for known good die (KGD) may be 16 times the cost of testing an unrepairable module and still be economical. This, of course, is modified by the ability to repair failed modules.

Testing of unpackaged die before packaging into multi-chip modules would be desirable as it would result in reduced material waste, increased profits, and increased throughput. Using only known good die in MCMs would increase MCM yields significantly.

Testing unpackaged die requires a significant amount of handling. Since the test package must be separated from the die, the temporary packaging may be more complicated than either standard discrete packaging or multichip module (MCM) packaging. The package must be compatible with test and burn-in procedures, while securing the die without damaging the die at the bondpads or elsewhere during the process.

We propose an approach for testing of unpackaged die which utilizes a two piece reusable burn-in/test fixture. The fixture consists of two halves, one of which is a die cavity plate for receiving a semiconductor die as the devices under test (DUT). A die is placed in a cavity in a first half of the fixture, and a die contact member is used to establish contact with bondpads on the die, and to conduct between the bondpads and external connector leads on the fixture.

External connector leads are used, and may be provided in a preferred configuration, such as a DIP (dual inline package) or QFP (quad flat pack) configuration. The fixture establishes electrical contact with a single die and with a burn-in oven, as well as permitting testing of dice in discretely packaged form.

Such a configuration requires that the die bondpads or other contact points be aligned with contacts in the fixture. The fixture must then maintain the die in alignment without damage to the die, and particularly to the bondpads. The fixture is then manipulated through test procedures.

One advantage of the temporary package is that it need not meet the requirements of a conventional package in terms of flexibility of installation; that is, it can be cumbersome and not readily adaptable to an end use other than the test and burn-in equipment. The die is expected to be moved out of the temporary package subsequent to testing, so that the package need only be useful for the various test and burn-in procedures.

Since the temporary package is specifically intended for test and burn-in procedures, it is desired that the package be easy to assemble on a temporary basis, and thereby at least partially facilitate the test and burn-in procedures.

In U.S. Pat. No. 4,899,107, commonly assigned, a reusable burn-in/test fixture for discrete TAB die is taught. The fixture consists of two halves, one of which is a die cavity plate for receiving semiconductor dies as the units under test (UUT); and the other half establishes electrical contact with the dies and with a burn-in oven.

The first half of the test fixture contains cavities in which die are inserted circuit side up. The die will rest on a floating platform. The second half has a rigid high temperature rated substrate, on which are mounted probes for each corresponding die pad. Each of a plurality of probes is connected to an electrical trace on the substrate (similar to a P.C. board) so that each die pad of each die is electrically isolated from one another for high speed functional testing purposes. The probe tips are arranged in an array to accommodate eight or sixteen dies.

The two halves of the test fixture are joined so that each pad on each die aligns with a corresponding probe tip. The test fixture is configured to house groups of 8 or 16 die for maximum efficiency of the functional testers.

There are some testing and related procedures when the parts are singulated. For this reason, it is inconvenient to retain multiple die in a single test fixture.

Various forms of connections are used to connect the die to a package or, in the case of a multichip module (MCM), to other connections. These include wirebonding, TAB connections, bump bonding directly to substrate, and conductive adhesives.

The bondpads are conductive areas on the face of the die which are used as an interconnect for connecting the circuitry on the die to the outside world. Normally, conductors are bonded to the bondpads, but it is possible to establish electrical contact through the bondpads by biasing conductors against the bondpads without actual bonding.

One of the problems encountered with burn in and full characterization testing of unpackaged die is the physical stress caused by connection of the bondpads to an external connection circuitry. This problem is complicated by the fact that in many die configurations, the bondpads are recessed below the surface level of a passivation layer. The passivation layer is a layer of low eutectic glass, such as BPSG, which is applied to the die in order to protect circuitry on the die. (The term "eutectic" does not, strictly speaking, apply to glass, which is an amorphous fluid; however, the term is used to describe the characteristic of some glasses wherein, as a result of their formulation, they readily flow at a given temperature.)

The ohmic contact between bondpads or test points on a die and a known good die test carrier package has been a matter of interest. It is difficult to achieve and maintain consistent ohmic contact without damaging the bondpads and passivation layer on the die. The design criteria of such contacts is somewhat different from the design criteria of the carrier package.

A prior art apparatus for packaging semiconductor devices includes a carrier tray which accepts a plurality of ceramic type packages, such as DIP (dual in-line package) or QFP (quad flat pack) packages. With the carrier supporting the package, the die is inserted, secured to the package and electrically attached to the package. A metallic lid is supported on the package by a bridge clamp which is clamped to the carrier tray over the package. The bridge clamp, in turn, clamps the lid against the package. The lid is then fused to the package, typically by soldering. The packages are then removed from the carrier tray.

SUMMARY OF THE INVENTION

According to the invention, a semiconductor die is inserted into a carrier tray and positioned so that bondpads on the dies or similar contacts on the die are in alignment with die contacting members on a substrate. The die contacting members, in turn, connect the dies to external conductors. The dies are secured against movement by means of bridge clamps which bias the die against the substrate within the carrier. When the die is secured, the carrier is used as a test fixture in order to perform burn-in and test procedures on the dies.

In a preferred embodiment, the bridge clamp presses against a rigid cover which biases the die against the die contacting members on the substrate. In a preferred embodiment, the substrate with the die contacting members is below the die, on an opposite side of the die from the cover, and are mounted to the carrier by the use of a plurality of electrical terminal contacts on the carrier which engage contact pads on the substrate. The contact pads are in electrical communication with the die contacting members.

In a preferred embodiment, the bridge clamp engages the die carrier, thereby allowing the die carrier to be handled as a singulated package when the die is secured inside the die carrier.

According to the invention, semiconductor dies are inserted into a carrier tray and positioned so that bondpads on the dies or similar contacts on the die are in alignment with die contacting members on a substrate. The die contacting members, in turn, connect the dies to external conductors. The dies are secured against movement by means of bridge clamps which extend to the carrier tray. When the dies are secured, the carrier tray is used as a test fixture in order to perform burn-in and test procedures on the dies.

The use of a separate die supporting substrate allows substituting substrates. This enables the construction of a module which can accept a wide variety of dies. Therefore the requirement of burnin and test equipment to mechanically handle different types of die carriers for the different types of dies is reduced or eliminated. In addition, different substrates can be designed to accommodate a wide variety of die bondpad configurations, such as edge connect, end connect, and lead over chip (LOC). This allows the die carrier to accept these different bondpad configurations.

Since the die carrier is intended for burnin and test applications, it need not be excessively compact, and may be robust in construction. This permits the carrier to accept external connections from a variety of test equipment, such as edge connections, top and bottom contacts and, in one embodiment, plug or DIP connections.

In one embodiment, a carrier tray supports a plurality of die carriers which individually support the dies. The carrier tray then supports the plurality of carriers during burnin and/or test procedures, thereby expediting handling of multiple dies.

In an alternative embodiment, the invention uses the carrier tray in cooperation with bridge clamps for retaining the dies in place. This enhances the stability of the connection of the dies to external connection terminals on the die carrier fixtures, since the die carrier fixtures need not be moved (or in some configurations cannot be moved) with respect to the carrier tray. The invention allows the tray which supports the bridge clamps to be used as a part of burnin and test fixtures, thereby facilitating the burn-in and test process. As is the case with the singulated carriers, the bridge clamps press against a rigid cover which biases the die against the die contacting members on the substrate.

DETAILED DESCRIPTION OF THE PREFERRED EMBODIMENTS

Figure 1:
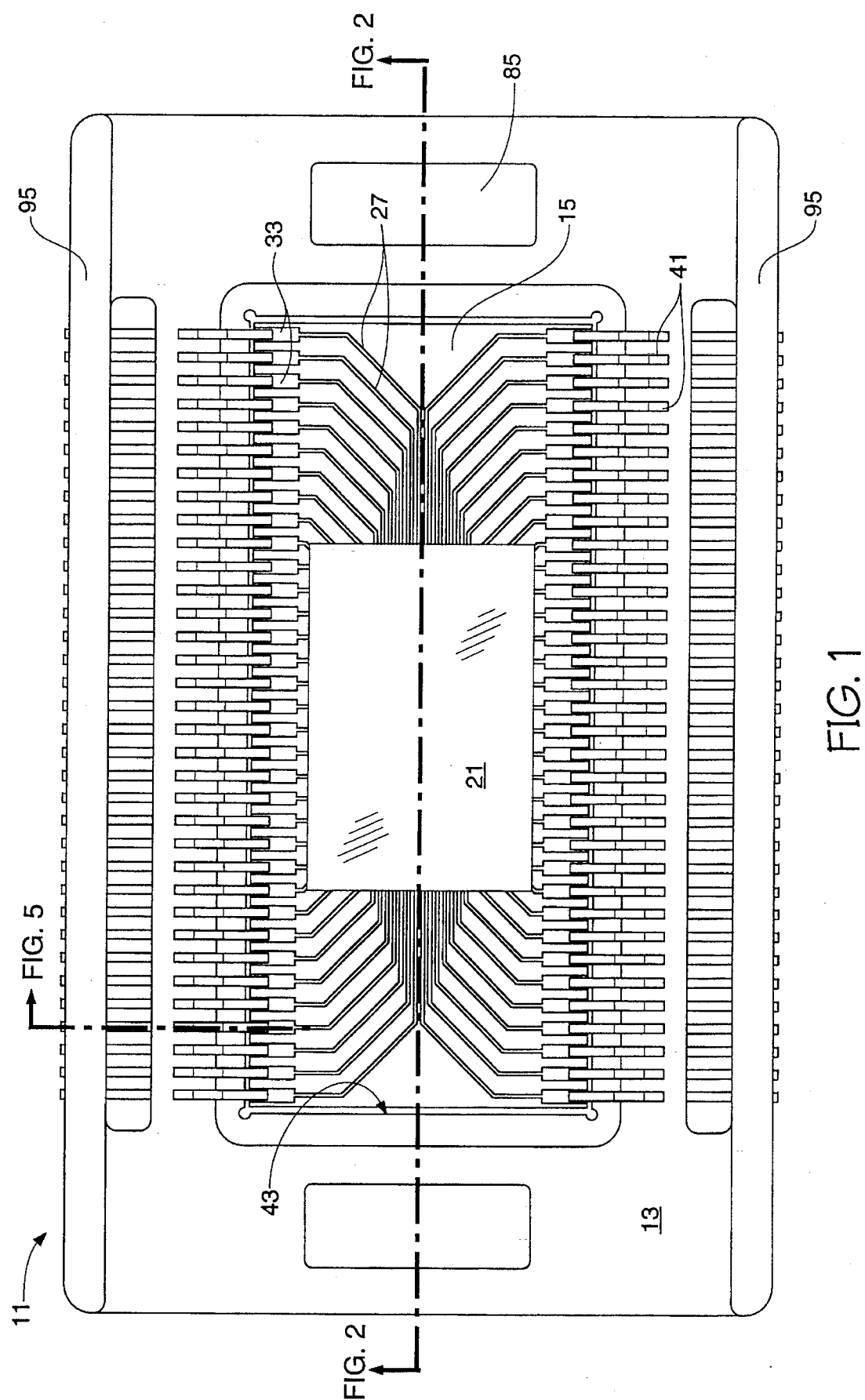
FIGS. 1-2 are top and side views of a semiconductor die carrier housing constructed in accordance with the invention.
Figure 2:
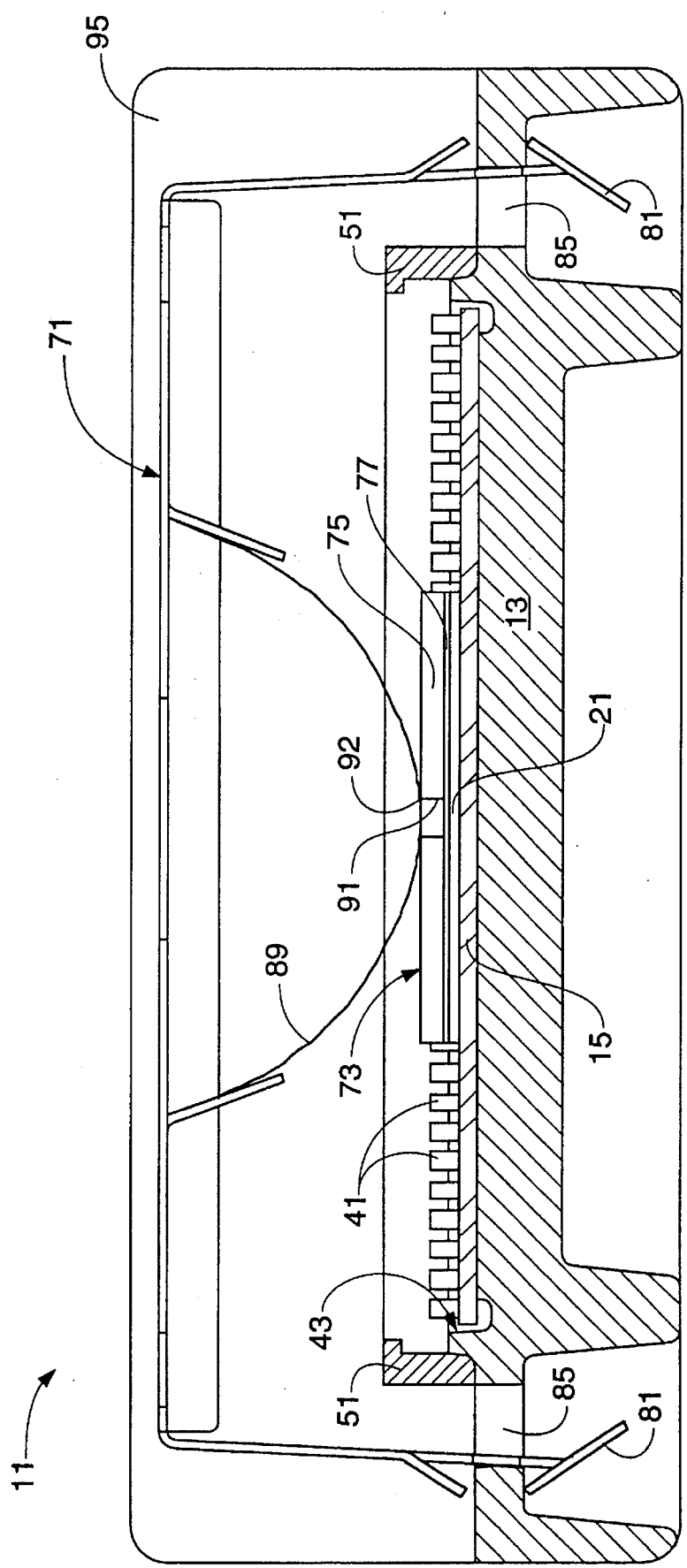

FIGS. 1-2 are top and side views of a semiconductor die carrier housing 11, in which a base 13 functions as a support for a die supporting substrate 15. A semiconductor die 21 is placed in a juxtaposed relationship with the substrate 15.

Figure 3:
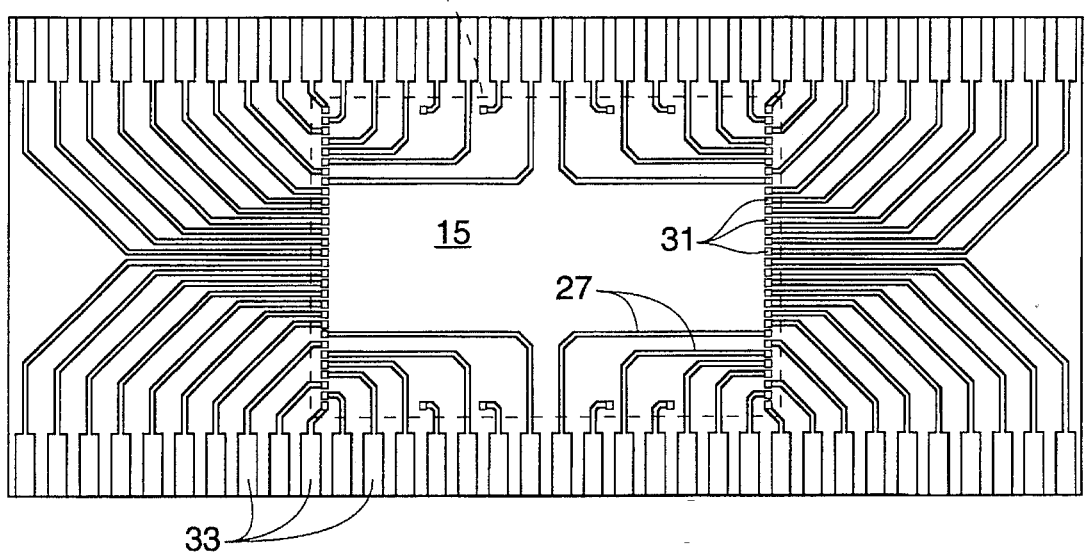
FIG. 3 shows details of a die supporting substrate used in the housing of FIGS. 1-2.

The substrate 15, shown in detail in FIG. 3, has superimposed thereon a plurality of circuit traces 27 which extend from bondpad contacts 31 to contact pads 33. The bondpad contacts 31 are positioned on the substrate 15 so as to mirror an arrangement of bondpads or contact pads on the die 21 (not shown in FIGS. 1-3). With the bondpad contacts 31 so positioned, the die 21 can aligned with the substrate 15 so that the bondpad contacts 31 are in alignment with bondpads or contact pads on the die 21.

The contact pads 33 extend along one or more edges of the substrate 15, which facilitates connection of the substrate 21 to terminal contacts 41 in the housing 11.

Referring again to FIGS. 1-2, the base 13 receives the substrate 15 within a recess 43, with the terminal contacts 41 extending across the substrate 15 sufficiently to contact the contact pads 33. This establishes an ohmic contact between the terminal contacts 41 and the contact pads 33 and therefore establishes electrical continuity with the bondpad contacts 31, by conducting through the circuit traces 27. When the die 21 is placed into electrical contact with the bondpad contacts 31, the terminal contacts 41 are in electrical communication with the die 21 through the bondpads on the die.

Figure 4:
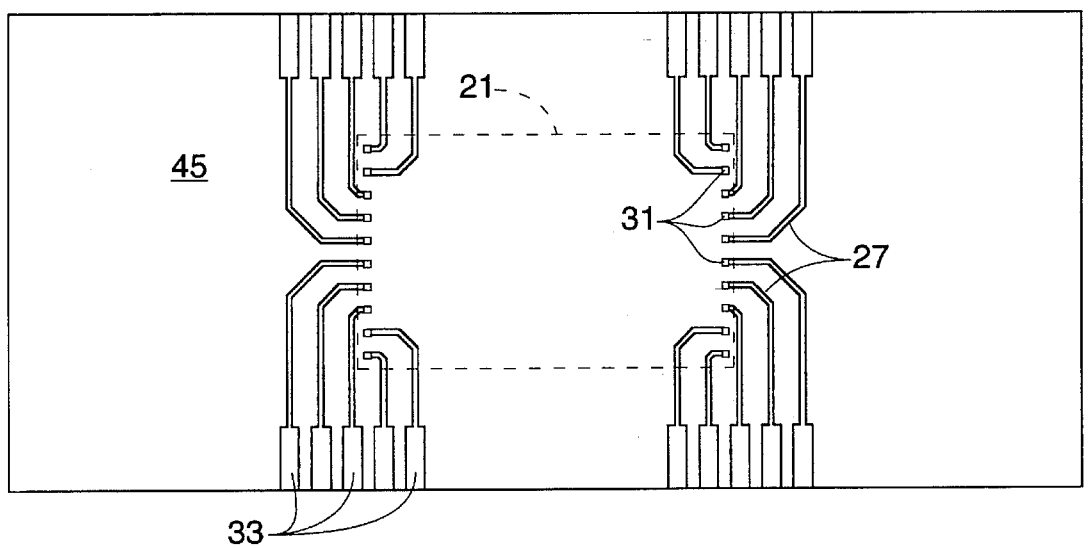
FIG. 4 shows an alternate substrate which may be substituted for the substrate of FIG. 3 in the housing of FIGS. 1-2.

Because of the alignment of the bondpad contacts 31 on the substrate 15, the substrate must be designed to conform with a particular bondpad layout on a die. This typically means that the substrate is specific to a specific die design, and will not work on other designs unless they share bondpad layouts, which usually limits the use of the particular substrate to one die family, if not to just a single configuration. For this reason, different substrates, such as substrate 45 shown in FIG. 4, may be constructed which conform to the layout of terminal contacts 41 in the housing 11, permitting interchangeability of different substrates 15, 45, accepting different die designs.

Figure 5A:
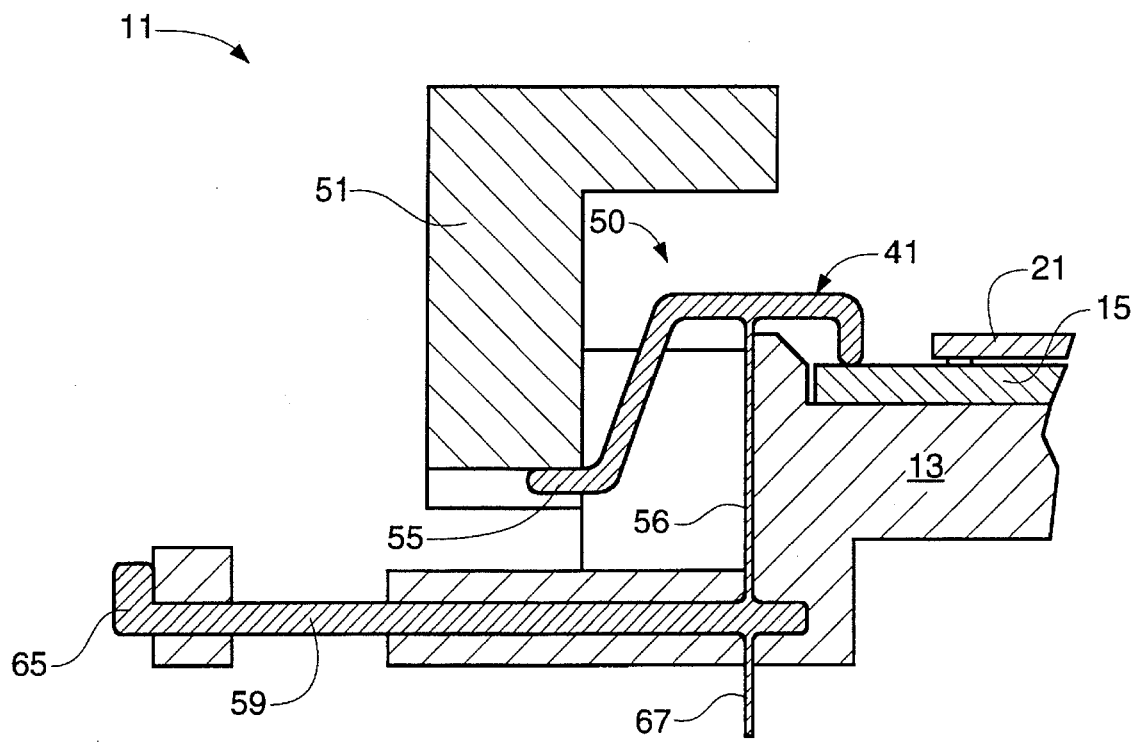
FIGS. 5A and 5B are the housing 11, showing a release mechanism for holding the substrates of FIGS. 3-4 in the housing.
Figure 5B:
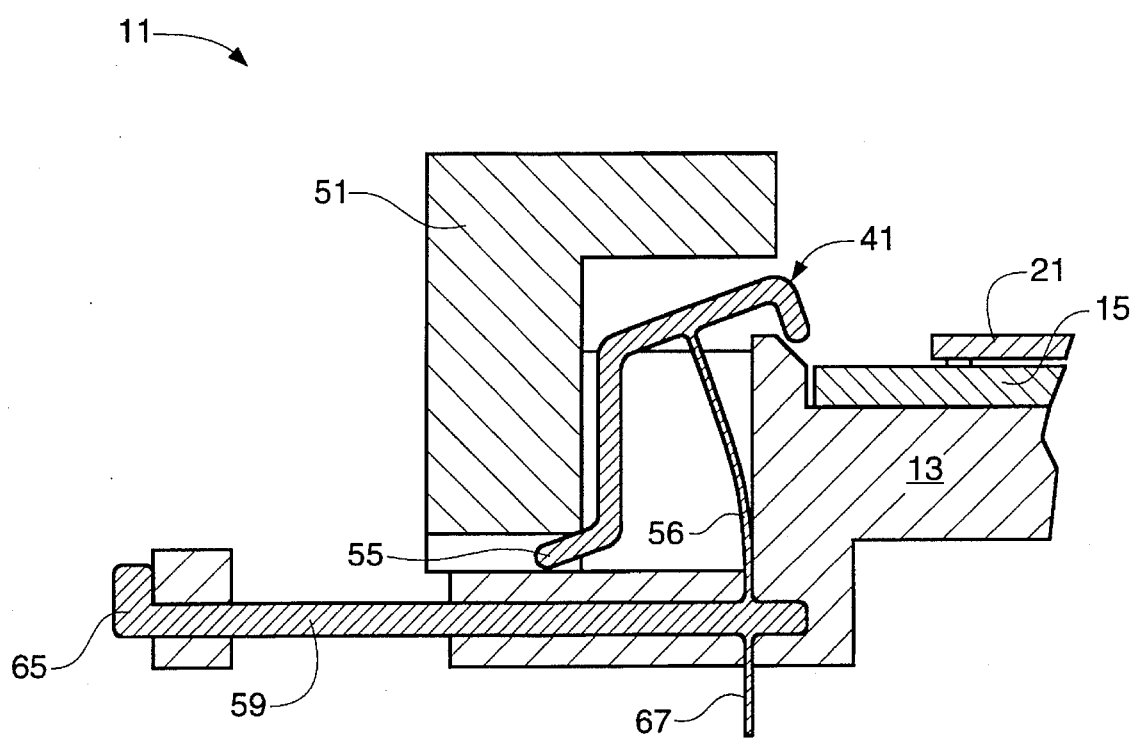

FIG. 5 show details of the housing 11, whereby the substrate 15 (or 45) may be releasably held within the housing 11. In the preferred embodiment, the substrate 15 is secured from the top by the terminal contacts 41, with the contact pads 33 being located on the top of the substrate 15. This provides a positive latching mechanism and combines the electrical contact function of the terminal contacts 41 with the retention function. A release sleeve 51 extends around the base 13 and engages a lever extension 55 of each of the terminal contacts 41 to cause the terminal contact 41 to bend up and away from the substrate 41 as shown in FIG. 5B. This is merely a preferred embodiment, as it is possible to engage the substrate in other manners and to establish electrical contact with the substrate 15 in any convenient manner. As an example, if the substrate 15 is sufficiently thick, the substrate 15 may be retained within the carrier base 13 by edge biasing.

The terminal contacts 41 have connection extensions 59 which permit external connection to the terminal contacts 41, which permits connection to the die 21 through the housing 11 for purposes of burn-in and testing of the die 21. These connection extensions 59 are also apparent from the view of FIG. 1. The substrate 15, when retained within the base 13 is therefore essentially unitary with the base 13 and is connectable to the burn-in and test circuitry through the connection extensions 59.

The connectable extensions 59 are open above and below the extensions 59 so that the extensions 59 may be reached from above or below the housing 11. Additionally, end flanges 65 permit edge connection of the carrier, by contacting the extensions from the edge flanges 65. Downward extending pins 67 are shown in FIGS. 5, which allow connection into DIP sockets. It is anticipated that in the preferred embodiment, the downward extending pins 67 will be left off.

Referring to FIG. 1 and FIG. 2, the die is aligned with the substrate 15 and secured against the base 13 by a bridge clamp 71. The bridge clamp 71 biases a cover 73. The cover 73 includes a rigid cover plate 75 and an optional resilient compressible elastomeric strip 77, which serves as a resilient biasing member. When the cover plate 75 is secured to the die cavity plate 13, the elastomeric strip 77 biases die 21 against the substrate 15, thereby establishing ohmic connections between the bondpads on the die 21 aligned with the bondpad contacts 31. The elastomeric strip 77 is shown immediately subjacent the cover 73. It is also possible to locate the elastomeric strip 77 elsewhere in the carrier, such as below the substrate 15.

Referring again to FIGS. 1, the bridge clamp 71 is placed over the cover 73 and is used to secure the cover 73 against the base 13, and consequently secure the die 21 into ohmic contact with the bondpad contacts 31. This also secures the die 21 into alignment with the bondpad contacts 33. The cover 73 is supported on the package by the bridge clamp 71 which is clamped to the base 13 or to a separate carrier tray (not shown).

The clamp 71 has tab catches 81, which mate with a pair of corresponding slots 85 in the base 13. A spring 89 extends downward into interference with the cover 73 when the tab catches 81 engage the slot, thereby biasing the clamp 71 against the cover 73, and consequentially biasing the die 21 into ohmic contact to connect with the terminal contacts 41.

The clamp 71 is open at the top and the spring 89 has an aperture 91. The cover 73 has a corresponding hole 92 which aligns with the spring aperture 91 and permits vacuum to be applied to the die 21 during the alignment and attachment of the clamp 71 and cover 73 to the carrier tray 11 and the base 13. The die 21 and cover 73 are mechanically aligned with the clamp 71, so that optical alignment does not take the clamp 71 out of mechanical alignment with the carrier tray 11. After the clamp 71 is engaged with the carrier tray 11, the clamp 71 may shift position, provided that the cover 73 does not also shift and cause the die 21 to shift. The contact force applied by the clamp 71 must be sufficient to push through a layer of aluminum oxide (not shown) which typically forms on aluminum bond pads. Penetration of the aluminum oxide layer is necessary for good electrical contact, since aluminum oxide is a poor electrical conductor. A force of about 80 grams per contact was found to be sufficient for contacts and bond pads as described above. It is anticipated that a force greater than 80 grams per contact will be applied when a silicon is used for the substrate for the die supporting substrate 15. The optimum force per contact will vary according to materials of the bondpads 27 and bondpad contacts 31, and the physical shape of the bondpad contacts 31.

The cover 73 is a commercially available, low cost metal item. A ceramic semiconductor package lid approximately 0.01" in thickness was found to be sufficient to function as the cover 73, although any reasonable lid thickness would function sufficiently, and in an alternate embodiment, the lid was a 0.045" thick austenitic stainless steel. Other materials may function adequately.

A coating of PTFE (Teflon™) material is applied to the exterior side of the cover 73 in order to electrically isolate the back side of the die 21 from the clamp 71 and to facilitate relative movement of the clamp 71 and cover 73. The relative movement of the clamp 71 and the cover 73 helps to avoid causing the cover 73 to shift against the substrate 15, and consequently helps avoid causing the die 21 to shift within the housing 11. A one-sided adhesive tape or a Kapton (TM, E. I. dupont de Neumours Co.) tape may be used instead of the coating of PTFE.

In the preferred embodiment, the die 21 is secured to the cover 73 and the cover 73 is aligned with the die cavity plate 13 by optical alignment techniques known as, "flip chip bonding." Such equipment is available from Research Devices of Piscataway, N.J. The alignment system is usually used for flip chip die attachment, but functions sufficiently in the inventive capacity.

The hole 92 in the cover 73 aids in securing the die 21 in alignment with the cover 73 during the flip chip process. To attach the die 21 to the cover 73, a vacuum device (not shown) picks up the cover 73 with the vacuum device placed over the hole 92. The vacuum is sufficient to hold the cover 73 against the clamp 71. The die 21 is then picked up with the vacuum in an aligned contact with the cover 73. The cover 73 and die 21 are then lowered onto the substrate 15, thereby permitting the alignment of the bond pads with the bondpad contacts 31. This vacuum arrangement was found to preclude the need for the adhesive polymer which would otherwise be used to attach the die 21 to the cover 73.

Once the die 21 is secured to the cover 73 by vacuum or other means, the cover 73 is positioned over the substrate 15. The bond pads on the die 21 are aligned with the bondpad contacts 31 on the substrate 15. This results in ohmic contact between the bond pads on the die 21 with the bondpad contacts 31 on the substrate 15. The contact force must be sufficient to push the bondpad contacts 31 through the layer of aluminum oxide (not shown) which typically forms on the aluminum bond pads.

An upwardly extending shroud 95 is fixed to the base 13. The shroud 95 extends from the base 13 upwardly to a level above the substrate 15 sufficiently to shield the bridge clamp 71 from accidently being pushed during handling. This reduces the probability that the bridge clamp 71 will be moved against the base 13 before it is intended to release the die 21 from the housing 11. Such movement would otherwise produce failed test results and may damage the die 21. In the initial embodiment, the shroud 95 is surrounded by the release sleeve 51, but it is anticipated that the invention will be modified to place the release sleeve 51 within the confines of the shroud 95, as shown in FIGS. 1 and 2; this in order to prevent accidental release of the substrate 15.

Figure 6:
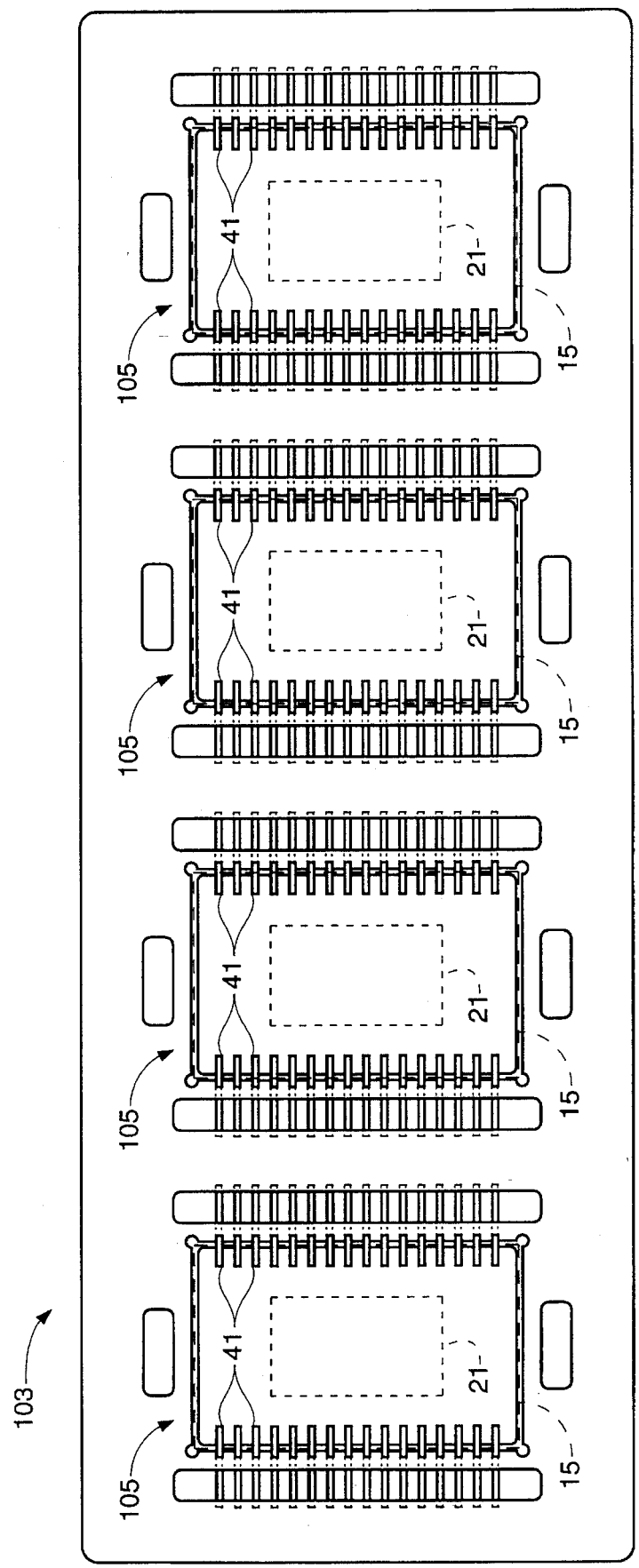
FIG. 6 shows an arrangement in which a carrier tray carries a plurality of housings.

FIG. 6 shows an arrangement in which a carrier tray 103 carries a plurality of housings 105. Each housing 105 supports a substrate 15 and has plurality of terminal contacts 41. The carrier tray 103 is adapted to support the housings 105 during a procedure in which the semiconductor integrated circuit dies 21 are inserted into the housings 105 in a positional alignment within the housings 105, and temporarily connected to electrically communicate with the terminal contacts 41.

The die supporting substrate 15 is preferably formed of silicon. This provides advantages in that coefficients of thermally induced expansion are matched with the die 21. Referring again to FIGS. 3–4, the circuit traces 27, bondpad contacts 31 and contact pads 33 are preferably on a top surface of the die supporting substrate 15. The use of silicon or other semiconductor material for forming the die supporting substrate 15 permits the circuit traces 27 and contacts 31, 33 to be formed on the substrate 15 by semiconductor circuit fabrication techniques, such as those used to form conductive lines and bondpads on semiconductors integrated circuit devices.

The die supporting substrate 15 may be formed as a rigid, semirigid, semiflexible or flexible material. In the case of silicon, as the substrate material, it is possible to form the material thin enough that it is at least semiflexible. In the preferred embodiment, a rigid substrate is used.

In the preferred embodiment, the die supporting substrate 15 is substantially rigid. The rigidity is sufficient that, when the die supporting substrate 15 is aligned with the die 21, the height of the bondpad contacts 31 nearly align in a Z axis direction with the bondpads 27 and that contact is established between the bondpads 27 and bondpad contacts 31 without the need to significantly distort the die supporting substrate 15. Typically such contact is achieved at all desired points by allowing the bondpad contacts 31 to be depressed, or by the use of a Z-axis anisotropic conductive interconnect material (161, FIG. 8).

The die supporting substrate 15 may also be formed of other semiconductor process materials such as silicon on sapphire (SOS), silicon on glass (SOG) or semiconductor process materials using semiconductor materials other than silicon.

Figure 7:
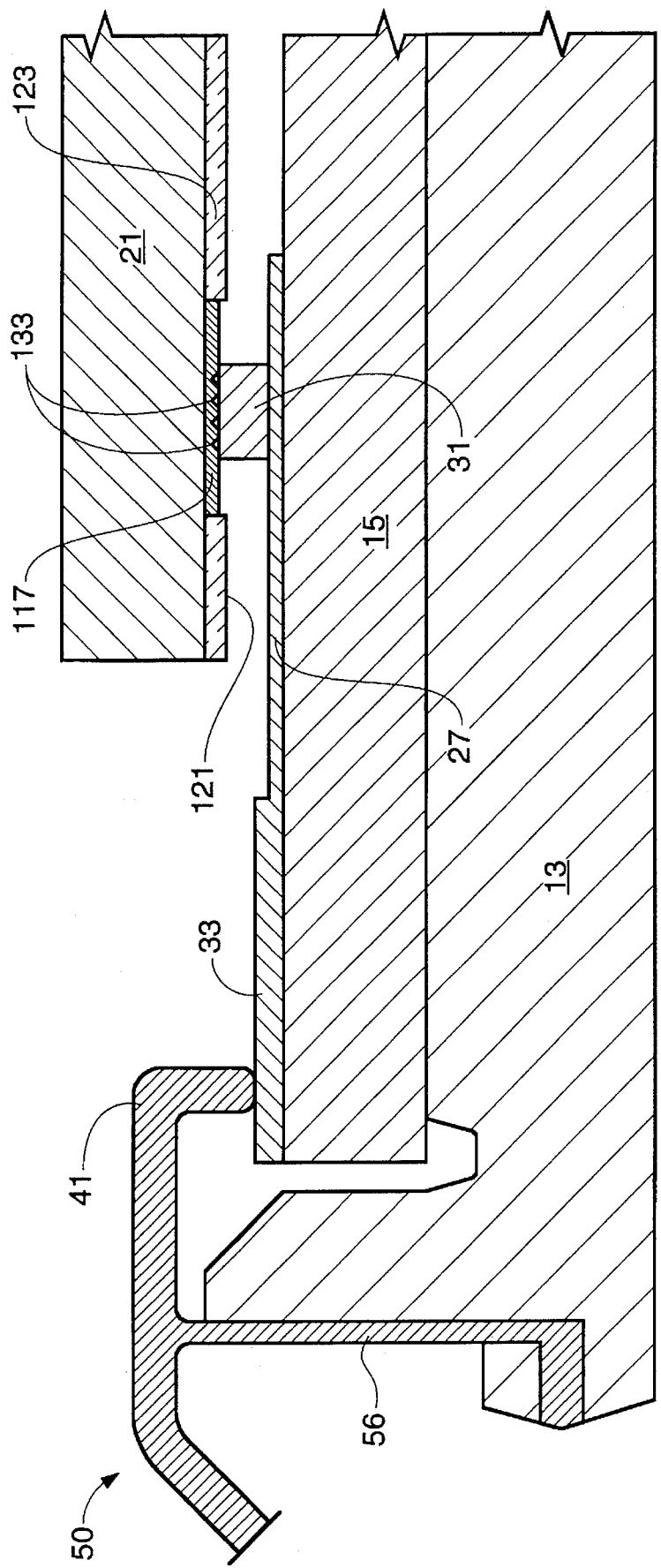
FIG. 7 shows details of a bondpad contact in which raised portions limit penetration depth into the bondpad.

The bondpads 117, as can be seen in FIG. 7, are typically recessed below a top surface level 121, established by a BPSG passivation layer 123.

Also as shown on FIG. 7, the bondpad contacts 31 on the die supporting substrate 15 may be formed with raised portions 133. The raised portion 133 may penetrate the bondpad 117, while the remainder of the bondpad contact 31 functions to limit penetration depth of the raised portion 133. This permits the penetration depth of the bondpad contact 31 to be controlled by the physical dimensions of the raised portion 133. This results in the bondpad contacts 31 being self-limiting in their penetration of the bondpads 117, since the force required to cause the raised portion 133 to penetrate the bondpad 117 is significantly less than the force required for the remainder of the bondpad contact 31 to penetrate the bondpad 117.

The result is the raised portion 133 causes an indentation in the bondpad 117 but the indentation preferably is less than the thickness of the bondpad 117. The remainder of the bondpad beneath the bondpad contact 31 may be slightly distorted, but remains fully workable in subsequent assembly operations. For subsequent assembly operations, the bondpad 117 may be treated as if it were undamaged, and therefore the bondpad is considered not to be significantly damaged.

The ratio of force will vary according to materials and dimensions, but ratios of at least 2:1 permissible force to required force are expected. If the percentage of the bondpad contact 31 which is raised is sufficient, higher ratios, such as 4:1, 10:1 and greater may be expected. This is significant because variations in planarity may be expected on the die supporting substrate 15 and the die 21.

The use of an die supporting substrate 15 allows dies with different patterns of bondpads 117 to be aligned with a version of the intermediate circuit trace substrate 15 custom made for that die, with several variants 15, 45 of the die supporting substrate mating with the same base plate 13.

Since the die supporting substrate 15 also has the bondpad contacts 31 thereon, the lifetime of the bondpad contacts 31 is not directly determinative of the lifetime of the housing 11. The fact that the conductive traces 27 are on the top surface of the die supporting substrate 15 facilitates the formation of elevated contacts on the bondpad contacts 31, and allow the use of materials which are suitable for the formation of the elevated contacts.

Figure 8:
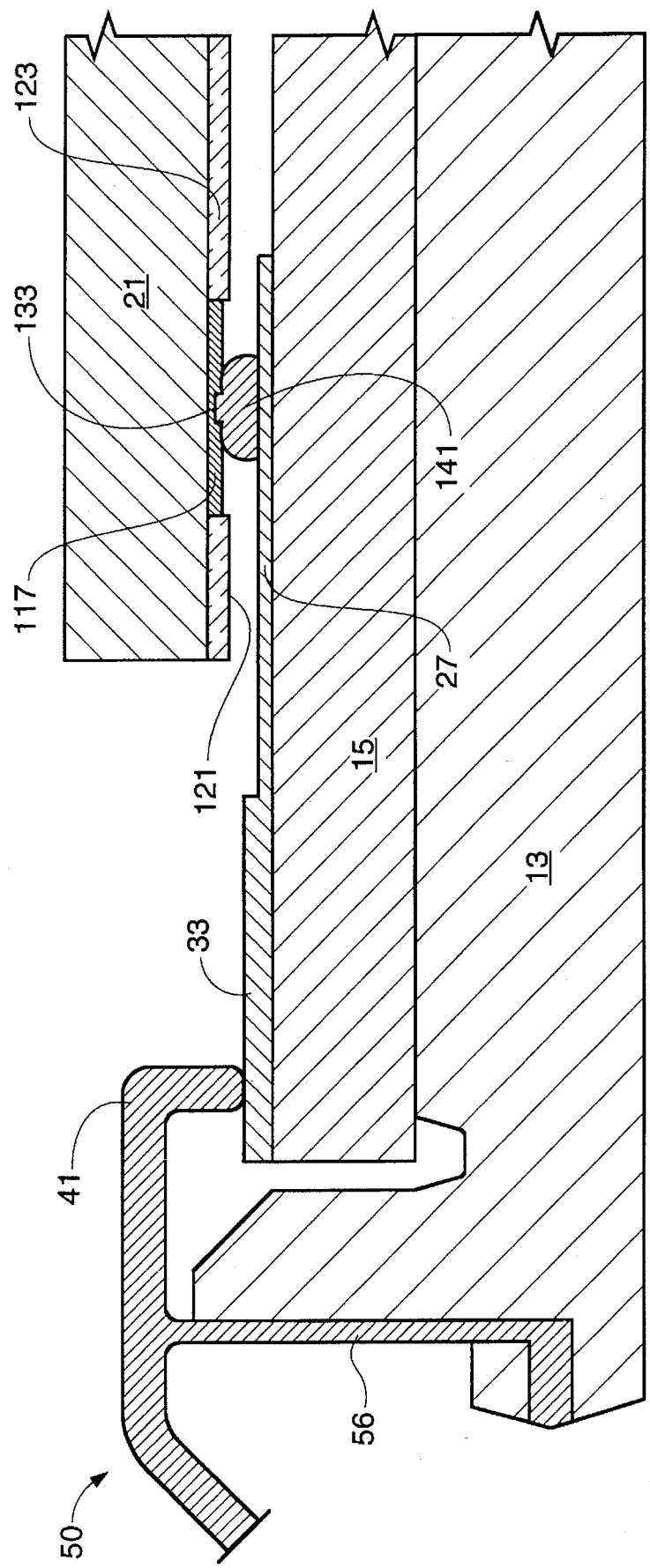
FIG. 8 shows details of a bondpad contact formed with a raised asperity.

Alternatively, as shown in FIG. 8, the die supporting substrate 15 may be formed from a ceramic material. If the bondpad contacts 31 are plated onto the substrate 15, raised asperities 141 are located at the point of contact of the bondpad contacts 31 with the bondpads. The raised asperities 141 are formed on the bondpad contacts 31. In the case of a ceramic intermediate substrate, the asperities are formed by a combination of photoplating techniques and doinking. Other techniques for depositing material may be used in lieu of photoplating, such as stenciling, screen printing or direct writing. The doinking process is described in U.S. Pat. No. 5,249,450, for PROBEHEAD FOR ULTRASONIC FORGING, by Alan Wood, David Hembree, Larry Cromar and Warren Farnworth. It is anticipated that the die supporting substrate 15 may be repeatedly used, and the bondpad contacts 31 re-doinked between uses.

Figure 9:
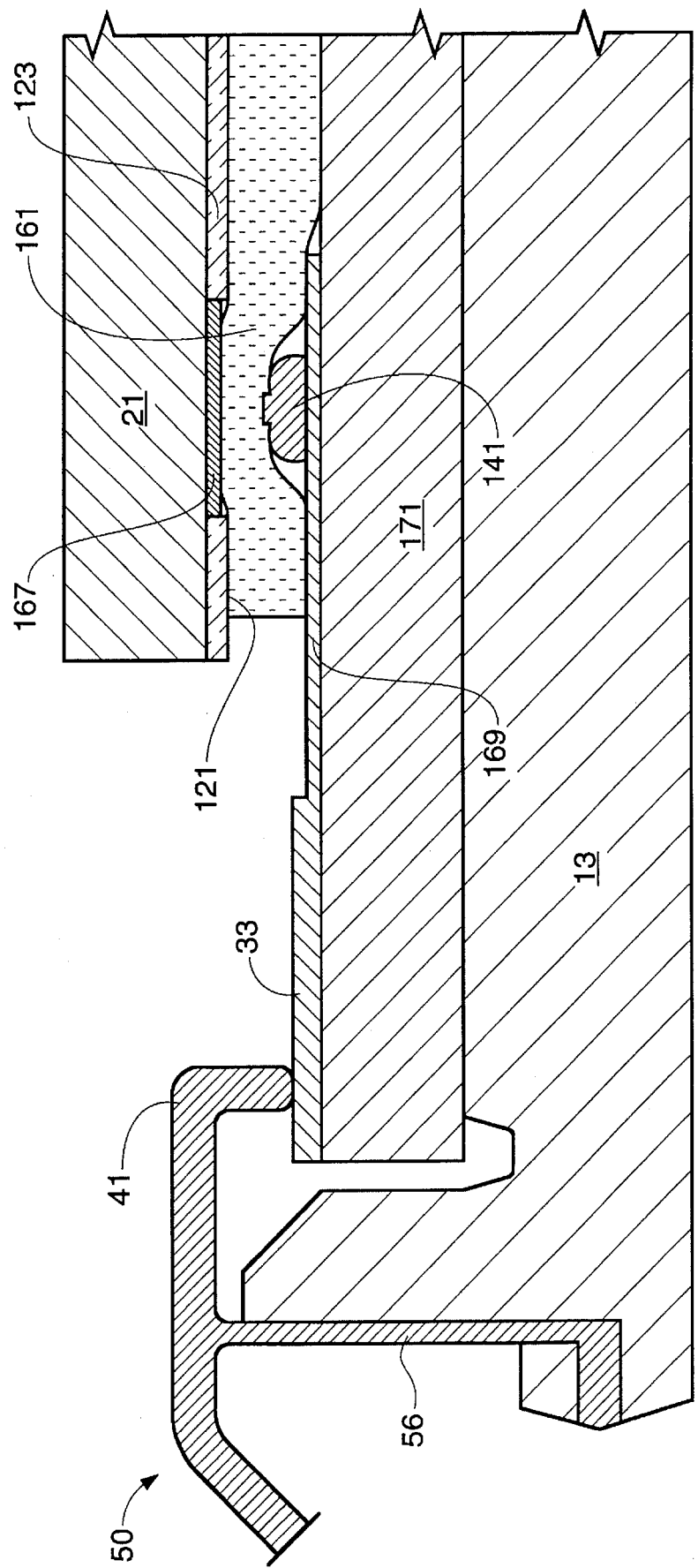
FIG. 9 shows the use of a Z-axis anisotropic interconnect material used to establish ohmic connections between the die and the contact pads on the die supporting substrate.

As shown in FIG. 9, it is possible to use a Z-axis anisotropic interconnect material 161 to establish ohmic connections between the bondpads 167 on the die 21 and bondpad contacts 169. This establishes an ohmic contact between the bondpads 167 and the conductive traces 27 without the contacts 169 directly engaging the bondpads 167. When the cover plate 75 is secured to the die cavity plate 13, the cover 73 biases the Z-axis anisotropic conductive interconnect material 161 against the die 21 and a substrate 171. The substrate plate 171 may be dielectric with conductive traces, and may be ceramic or a semiconductor plate.

The Z-axis anisotropic conductive interconnect material 161 is particularly useful in cases in which the bondpads 167 are recessed below a BPSG passivation layer on the die 21. Other advantages of the Z-axis anisotropic conductive interconnect material 161 result from it being easily replaced when sequentially testing different dies 21 in the same package. The Z-axis anisotropic conductive interconnect material 161 is able to elastically deform in establishing ohmic contact with the bondpads 167, so that replacement or redoinking of the intermediate plate 165 may be required less often.

The self-limiting contacts, such as contacts 31 shown on FIG. 7, are useful in controlling the penetration of the Z-axis anisotropic conductive interconnect material 161 into the die bondpads 167. Analogous to the direct contact with the bondpad, the raised portion causes the Z-axis anisotropic conductive interconnect material 161 to penetrate the bondpad 167, while the remainder of the bondpad contact 31 functions to limit penetration depth of the raised portion. This permits the penetration depth of the bondpad contact 31 to be controlled by the physical dimensions of the bondpad contact 31. This results in the bondpad contacts 31 being self-limiting in their penetration of the bondpads 167, since the force required to cause the raised portion to penetrate the bondpad 167 is significantly less than the force required for the remainder of the bondpad contact 31 to penetrate the bondpad 167.

Once the die 21 is mounted within the housing 11, the die 21 may be burned in and tested in a manner similar to burn-in and test of ordinary singulated packaged dies. This testing includes thermal testing from at least 15° C. to 125° C. It is more likely that testing will take place at temperature ranges of from −10° C. to 125° C. In the case of some military or adverse condition rated semiconductor parts, testing would occur at a range of from −55° C. to 150° C.

Clearly, other embodiments of the invention are possible and are anticipated. As an example, the terminal contacts 41 may be mounted to the release sleeve 51 so that the relative movement of the release sleeve 51 and base plate 13 causes the desired deflection of the terminal contacts 41. The retention of the substrate 15 may be by means other than the terminal contacts 41, provided that electrical connection of the traces 27 to external circuitry is made. Accordingly, the invention should be considered limited only by the claims.

What is claimed is:

1. Apparatus for testing a discrete bare semiconductor die, comprising:

a) a substrate for providing an electrical connection between the die and test circuitry;
   b) the substrate including a plurality of contacts in electrical communication with circuit traces, said contacts adapted to establish electrical communication with contact locations on the die;
   c) a base for retaining the die and substrate;
   d) a latching mechanism attached to the base for securing the substrate to the base, said latching mechanism including terminal contacts adapted to contact the substrate and establish an electrical connection between the circuit traces on the substrate and the test circuitry; and
   e) clamp means attached to the base for biasing the die and substrate together and forcing the contacts on the substrate against the contact locations on the die with a predetermined force.

2. Apparatus as described in claim 1, and wherein:

a) the circuit traces are in electrical communication with contact pads formed on the substrate; and
   b) the terminal contacts of said latching mechanism engage said contact pads on the substrate.

3. Apparatus as described in claim 2, and wherein:

a) a release member is attached to the base, the release member being movable relative to the substrate;
   b) the terminal contacts are formed as latches releasable by movement of the release member;
   c) the relative movement of the release member is adapted to move the terminal contacts out of engagement with the substrate.

4. Apparatus as described in claim 1, wherein said substrate further comprises:

a raised portion formed on each contact, the raised portion adapted to penetrate its respective contact location on the die while a top surface of the contact limits a penetration depth, thereby establishing electrical communication with said contact location.

5. Apparatus as described in claim 4, and wherein:

the plurality of contacts are formed on the substrate using semiconductor circuit fabrication techniques.

6. Apparatus as described in claim 6, and wherein:

the substrate is formed of silicon material, and the circuit traces are formed on the silicon material by semiconductor circuit fabrication techniques.

7. Apparatus as described in claim 4, and further comprising:

a pad which is electrically conductive in a Z-axis, normal to a plane of the pad, and which provides electrical isolation across the plane of the pad, the pad being positioned between the die and the plurality of contacts.

8. An apparatus for testing a discrete, unpackaged semiconductor die comprising:

a base for retaining the die;
   a substrate placed within the base for establishing electrical communication between the die and test circuitry, the substrate including a contact adapted to penetrate a contact location on the die, and a circuit trace in electrical communication with the contact;
   a latching mechanism attached to the base for securing the substrate to the base and having a movable terminal contact adapted to contact the die supporting substrate to secure the die to the substrate and to establish electrical communication between the circuit trace and the test circuitry; and
   a bridge clamp removably attached to the base including a spring for applying a predetermined force to the die to bias the die against the substrate so that the contact on the substrate penetrates the contact location on the die.

9. The apparatus as claimed in claim 8 and further comprising:

contact pads formed on the substrate in electrical communication with the circuit traces for contact with the terminal contact.

10. The apparatus as claimed in claim 8 and wherein:

the contact on the substrate includes a raised portion adapted to pierce the contact location on the die while the remainder of the contact limits a penetration depth.

11. The apparatus as claimed in claim 8 and further comprising:

a cover placed between the clamp and die and including an opening to permit the die to be attached to the cover for loading into the apparatus using a vacuum.

12. The apparatus as claimed in claim 8 and wherein:

the substrate is formed of silicon using semiconductor circuit fabrication techniques.

13. The apparatus as claimed in claim 8 and wherein:

the substrate is formed of a ceramic material and the contacts are formed by doinking.

14. The apparatus as claimed in claim 8 and further comprising:

a Z-axis anisotropic interconnect material placed between the die and substrate.

15. The apparatus as claimed in claim 8 and wherein:

the base includes a recess for retaining the substrate.

16. An apparatus for testing a singularized, unpackaged semiconductor die comprising:

a base for retaining the die;
    a substrate mounted within the base for establishing electrical communication between the die and test circuitry, the substrate including a contact having a raised portion adapted to penetrate a contact location on the die while a remainder of the contact limits a penetration depth, and a circuit trace in electrical communication with the contact;
    a latching mechanism attached to the base for securing the substrate to the base and having a movable terminal contact adapted to contact the substrate to establish electrical communication between the circuit trace and the test circuitry; and
    a clamp removably attached to the base and including a spring for applying a predetermined force to the die to bias the die against the substrate so that the contact on the substrate penetrates the contact location on the die to a predetermined depth.

17. The apparatus as claimed in claim 16 and further comprising:

a cover placed between the die and spring and including an opening for attaching the die to the cover using a vacuum.

18. The apparatus as claimed in claim 16 and wherein:

the contact is formed as a bump having a pointed projection.

19. The apparatus as claimed in claim 16 and further comprising:

a release member attached to the base for moving the latching mechanism to move the terminal contact out of contact with the substrate.

* * * * *

UNITED STATES PATENT AND TRADEMARK OFFICE
CERTIFICATE OF CORRECTION

PATENT NO.   : 5,495,179
DATED        : February 27, 1996
INVENTOR(S)  : Alan G. Wood
               Warren M. Farnworth It is certified that error appears in the above-indentified patent and that said Letters Patent is hereby corrected as shown below:

In claim 8, Column 12, line 11, delete

"to secure the die to the substrate and"

Signed and Sealed this

Ninth Day of July, 1996

Attest:

BRUCE LEHMAN

*Attesting Officer*            Commissioner of Patents and Trademarks